United States Patent [19]
Philipossian et al.

[11] Patent Number: 5,385,630
[45] Date of Patent: Jan. 31, 1995

[54] PROCESS FOR INCREASING SACRIFICIAL OXIDE ETCH RATE TO REDUCE FIELD OXIDE LOSS

[75] Inventors: Ara Philipossian, Redwood Shores, Calif.; Hamid R. Soleimani, Westborough; Brian S. Doyle, Framingham, both of Mass.

[73] Assignee: Digital Equipment Corporation, Maynard, Mass.

[21] Appl. No.: 85,281

[22] Filed: Jun. 29, 1993

[51] Int. Cl.$^6$ ............................................. H01L 21/00
[52] U.S. Cl. ..................... 156/628; 156/662; 156/657
[58] Field of Search ................ 156/628, 662, 663, 657

[56] References Cited

U.S. PATENT DOCUMENTS

| | | | |
|---|---|---|---|
| 4,268,347 | 5/1981 | Stephens | 156/628 |
| 4,530,734 | 7/1985 | Klima | 156/628 |
| 4,978,418 | 12/1990 | Arnold, Jr. et al. | 156/628 |
| 4,999,083 | 3/1991 | Watanabe et al. | 156/628 |
| 5,135,605 | 8/1992 | Blonder et al. | 156/628 |

FOREIGN PATENT DOCUMENTS

| | | | |
|---|---|---|---|
| 131 | 1/1983 | Japan | 156/628 |
| 98932 | 6/1983 | Japan | 156/628 |
| 240131 | 11/1985 | Japan | 156/628 |
| 222137 | 10/1986 | Japan | 156/628 |
| 60032 | 3/1991 | Japan | 156/628 |

*Primary Examiner*—Thi Dang
*Attorney, Agent, or Firm*—Robert J. Feltovic; Denis G. Maloney

[57] ABSTRACT

$N_2$ implantation is used to increase the etch rate of a sacrificial oxide (sometimes referred to as the first gate oxide) in integrated circuitry. This implantation allows etching selectivity by changing the relative etch rates of materials. In the specific implementation described, a field oxide is also provided and this implantation increases the etch rate of the sacrificial oxide relative to that of the field oxide. No heat treatment is applied to the implanted material prior to etching having the ability to repair the damage caused by the bombardment.

14 Claims, 1 Drawing Sheet

PROCESS FOR INCREASING SACRIFICIAL OXIDE ETCH RATE TO REDUCE FIELD OXIDE LOSS

BACKGROUND OF THE INVENTION

The present invention relates to the fabrication of integrated circuitry and, more particularly, to increasing the etch selectivity of sacrificial silicon dioxide or other material.

Ion implantation is commonly used in the fabrication of integrated circuitry to provide desired doping. Precise dopant distribution profile, dopant concentration and depth of implantation is attained by carefully choosing the parameters of implantation and those of the subsequent thermal annealing of the target. When ion implantation is used in the initial stages of integrated circuitry fabrication to provide doping for voltage threshold purposes, it is common to grow a silicon dioxide layer first to protect the substrate. This thermal oxide layer generally is referred to as a "sacrificial" oxide layer. (It also is sometimes referred to as the "first gate" oxide.) It typically is removed after ion implantation by subjecting the substrate to a diluent solution of hydrofluoric acid (HF) which may or may not be buffered.

It is desirable in some fabrication processes to control the etch rate of the sacrificial oxide relative to other material on the same substrate that may come into contact with the etchant. For example, additional silicon dioxide material sometimes is deposited or grown in certain regions of a substrate, e.g., for shallow trench isolation, prior to exposure of the substrate to an etchant to remove the sacrificial oxide. This other oxide is commonly referred to as a field oxide. It is important that this field oxide maintain its planarity in view of further processing, e.g., the formation of crossover conductors on the same. Field oxide loss due to etching of a sacrificial layer is even a bigger problem if the field oxide is a LPCVD (low pressure chemical vapor deposition) layer, since field oxide deposited in this manner etches roughly 20% faster than conventional thermal oxide when both are exposed to aqueous HF. Thus it is desirable to increase the etch rate of the sacrificial oxide so as to reduce unwanted etching of the field oxide.

SUMMARY OF THE INVENTION

The present invention provides desired etch control and selectivity. From the broad standpoint, it includes the step of implanting the material to be etched with a multitude of implantation particles to increase its etchability by an etchant, e.g., a liquid, gas or a plasma. Such implantation will cause damage to the atomic lattice structure of the material. It is important that the material not be subjected to thermal treatment before etching after such implantation, since the induced damage can be repaired. Thus thermal annealing as is common after implantation will destroy the effect.

The experience and development of ion implantation for doping purposes makes such technique an ideal method of providing the desired lattice damage. It is desirable that the ions which are implanted be selected to be electrically neutral, i.e., not change the electrical characteristics of the substrate or any other permanent part of the integrated circuit which is being formed. If the material to be subjected to implantation is silicon dioxide, the implantation of nitrogen ions has been found to provide the desired results.

The implantation will increase the etch rate of the material it damages. For the desired selectivity, therefore, it is preferred that only that material to be removed be exposed to the implantation. Then when the substrate is subjected to the etchant, such etchant will remove the implanted material at an appreciably higher rate than it will etch the same material that has not been subjected to implantation. For example, the etch rate of a sacrificial oxide can be significantly increased by implanting relative to the etch rate of an unimplanted oxide, e.g., a field oxide.

Other features and advantages of the invention either will become apparent or will be described in connection with the following, more detailed description of a preferred embodiment of the invention.

BRIEF DESCRIPTION OF THE DRAWING

With reference to the accompanying drawing.

DETAILED DESCRIPTION OF THE PREFERRED EMBODIMENT(S)

The following relatively detailed description is provided to satisfy the patent statutes. However, it will be appreciated by those skilled in the art that various changes and modifications can be made without departing from the invention.

Figure 1:
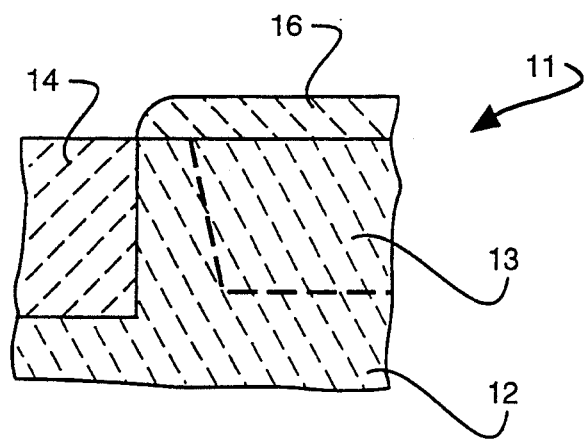
FIG. 1 is a highly enlarged and idealized schematic sectional view of a portion of a substrate illustrating two differing regions of silicon dioxide.

FIG. 1 is an idealized sectional view of an incomplete integrated circuit part 11, illustrating initial fabrication processing of active devices in a substrate made up of an epitaxial layer 12 on a silicon wafer (not shown). Although in this implementation an epitaxial layer 12 is provided, the invention is not, of course, limited to integrated circuitry using such a layer. The term "substrate" as used herein applies to the intermediate structure that is formed as the result of intermediate processing steps, as applicable, as well as to the original base material. The invention does not depend on the substrate being of a particular polarity. In the specific implementation being described the epitaxial layer 12 is doped (as will be explained) to be partially p-type (i.e., containing positively charged carriers called holes), and partly n-type (containing electrons) in the n-well regions. The p- and n-type doping are carried out by boron and phosphorus implantations, respectively, followed by thermal annealing, in a common manner. Isolation trenches having a thermal dioxide grown in the same as indicated at 14 are provided to isolate adjacent device regions from one another.

It is typical to provide means for adjusting the threshold voltage ($V_{th}$) of the devices to be formed. Shallow ion implantation (called threshold-adjust implant) in the active regions provides this function. A sacrificial oxide layer represented at 16 is grown on those portions of the substrate that receive the ion implantation. (Although shown as a separate layer on top of the epitaxial layer, it will be recognized that the formation of such layer by growth will consume a portion of the silicon and the layer will, in essence, be recessed slightly into the epitaxial layer.) After the sacrificial oxide layer is formed, the threshold-adjust implant is made. For a p-channel within an n-well region, a phosphorus or arsenic threshold-adjust implant is provided as required. For example, a phosphorus threshold adjust implant of approximately $1 \times 10^{12}$ atoms per $cm^2$ at 30 keV can be provided in the p-channel regions. In the n-channel regions, a shallow implant for threshold adjustment of approximately $5 \times 10''$ atoms per $cm^2$ at 20 keV is provided. A deep implant (approximately $10''$ atoms per $cm_2$ at 100 keV) may be required in some instances to guard against various punch-through mechanisms.

Figure 2:
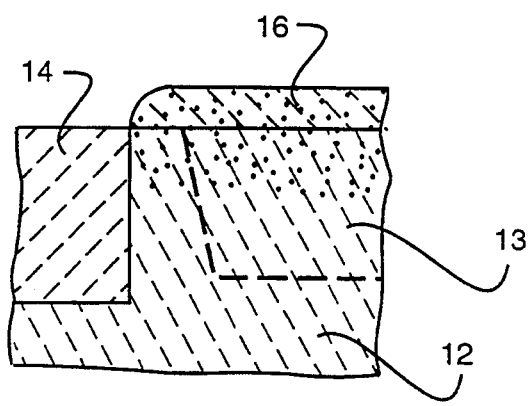
FIG. 2 is a view similar to FIG. 1 showing the substrate after two implantations: the threshold voltage adjust implant normally performed in CMOS technology and a second etch selectivity implantation of the invention.
Figure 3:
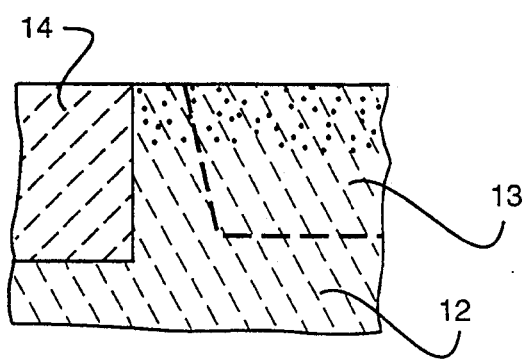
FIG. 3 is also an idealized view similar to FIG. 1 showing the structure resulting from selective etching.

In accordance with the invention, implantation in the sacrificial oxide layer is made after the threshold voltage adjust implants, to cause structural damage to the sacrificial oxide layer. The result of this damage is to increase the etch rate of the sacrificial oxide layer by exposing it to the etchant mechanism. This second implantation is most desirably achieved with implanted ions selected to be neutral with respect to the electrical characteristics desired for the adjacent and underlying regions. FIG. 2 illustrates an idealized arrangement, after typical threshold-adjust implantation and the sacrificial layer damage implantation.

The intensity and duration of the bombardment will, of course, depend upon many factors, including the relationship of the material to be removed, to the bombarding particles, the thickness of the material, the nature of the etchant, etc. For example, when a 150 Å thick layer silicon dioxide sacrificial material is to be removed with an aqueous HF solution (10:1) it is desirable to bombard the material with ion implantation of $N_2$ at a $10^{14}$ dose per $cm^2$.

It is important that no annealing be used between the nitrogen implant and heat input to the material before the etching, as this can repair the structural damage to the sacrificial oxide. It should be noted that it is common in ion implantation to thermally anneal the induced damage in the material for other purposes. For example, the inventors named in this application also filed on Jul. 29, 1993, patent application Ser. No. 08/099,136.

As mentioned at the beginning of the detailed description, Applicants are not limited to the specific embodiment described above. Various changes and modifications can be made. For example, although it is preferred that the threshold adjust implantation take place before the nitrogen implantation to assure that the precise control of the former which is needed is not disturbed, from the broad standpoint it is recognized that the nitrogen implantation could take place before the $V_{th}$ ion implantations. Moreover, although in the specific implementation described HF etching is used, any etching material and/or process is applicable to the invention as long as the same can take advantage of damage to the atomic lattice structure of the material to be etched. It is also applicable to the etching of materials besides silicon dioxide, e.g., Si, and $Si_3N_4$. The claims, their equivalents and their equivalent language define the scope of protection.

What is claimed is:

1. In the fabrication of integrated circuitry, the steps of:
   a) implanting a material on a substrate with nitrogen, to enhance the etchability of said material by an etchant by causing structural damage to said material; and
   b) exposing said material to said etchant.

2. The fabrication process of claim 1 wherein said step of implanting causes damage to the atomic structure of said material, further including after said step of implanting but before said step of exposing, the step of maintaining the heat input to said material at less than that at which said damage will be meaningfully repaired.

3. The fabrication process of claim 1 wherein said implantation species particles are atomic or molecular particles.

4. The fabrication process of claim 1 wherein said material is silicon dioxide and said implantation is at a dose rate of at least $10^{14}$ per square centimeter of surface of such silicon dioxide.

5. The fabrication process of claim 4 wherein said material is silicon dioxide formed by growth on a substrate of silicon.

6. The fabrication process of claim 1 wherein said step of exposing includes exposing said material to a diluent of hydrofluoric acid.

7. The fabrication process of claim 6 wherein said material is silicon dioxide grown on a substrate of silicon, and there is other silicon dioxide material deposited on said substrate.

8. The fabrication process of claim 6 wherein said diluent of hydrofluoric acid includes one or more constituents buffering said acid.

9. The fabrication process of claim 8 wherein said material is silicon dioxide.

10. In the fabrication of integrated circuitry, the step of tailoring nitrogen implantation of said material with a multitude of implantation conditions to customize the etch rate of said material.

11. The fabrication process of claim 10 wherein said material is silicon dioxide.

12. The fabrication process of claim 11 further including the step of exposing said material after said tailoring to a diluent of hydrofluoric acid as an etchant.

13. In the fabrication of integrated circuitry, increasing the etch rate of a silicon dioxide layer by implanting nitrogen in the same.

14. The fabrication process of integrated circuitry of claim 13 further including the step of exposing said silicon dioxide after said implantation to an etchant made up of a diluent of hydrofluoric acid.

* * * * *